United States Patent

Jaakola

[11] Patent Number: 5,884,149
[45] Date of Patent: Mar. 16, 1999

[54] MOBILE STATION HAVING DUAL BAND RF DETECTOR AND GAIN CONTROL

[75] Inventor: Mika Jaakola, Oulu, Finland

[73] Assignee: Nokia Mobile Phones Limited, Salo, Finland

[21] Appl. No.: 799,324

[22] Filed: Feb. 13, 1997

[51] Int. Cl.⁶ .................................................. H04B 1/04
[52] U.S. Cl. ..................... 455/103; 455/126; 455/127; 455/553
[58] Field of Search ..................... 455/127, 126, 455/115, 103, 552, 553, 101, 102, 117, 129; 330/129; 333/17.1, 132; 375/216

[56] References Cited

U.S. PATENT DOCUMENTS

| | | | |
|---|---|---|---|
| 4,955,083 | 9/1990 | Phillips et al. | 455/103 |
| 5,043,672 | 8/1991 | Youn | 330/129 |
| 5,101,175 | 3/1992 | Vaisanen | 330/279 |
| 5,109,538 | 4/1992 | Ikonen et al. | 455/89 |
| 5,152,004 | 9/1992 | Vaisanen et al. | 455/68 |
| 5,204,643 | 4/1993 | Verronen | 333/81 R |
| 5,214,372 | 5/1993 | Vaisanen et al. | 324/95 |
| 5,230,091 | 7/1993 | Vaisanen | 455/88 |
| 5,241,694 | 8/1993 | Vaisanen et al. | 455/68 |
| 5,276,917 | 1/1994 | Vanhanen et al. | 455/89 |
| 5,291,147 | 3/1994 | Muurinen | 330/136 |
| 5,291,150 | 3/1994 | Saarnimo et al. | 330/279 |
| 5,363,071 | 11/1994 | Schwent et al. | 333/111 |
| 5,392,464 | 2/1995 | Pakonen | 455/115 |
| 5,404,579 | 4/1995 | Obayashi et al. | 455/553 |
| 5,404,585 | 4/1995 | Vimpari et al. | 455/115 |
| 5,422,931 | 6/1995 | Austin-Lazarus et al. | 455/553 |
| 5,432,473 | 7/1995 | Mattila et al. | 330/133 |
| 5,434,537 | 7/1995 | Kukkonen | 330/2 |
| 5,450,620 | 9/1995 | Vaisanen | 455/127 |
| 5,493,255 | 2/1996 | Murtojarvi | 330/296 |
| 5,530,923 | 6/1996 | Heinonen et al. | 455/126 |
| 5,548,616 | 8/1996 | Mucke et al. | 375/295 |
| 5,564,074 | 10/1996 | Juntti | 455/67.1 |
| 5,752,170 | 5/1998 | Clifford | 455/126 |

Primary Examiner—Reinhard J. Eisenzopf
Assistant Examiner—Lester G. Kincaid
Attorney, Agent, or Firm—Perman & Green, LLP

[57] ABSTRACT

A multi-band mobile station (10) includes a plurality of RF amplifier sections, one for each frequency band of interest; a controller (18) for selectively enabling, when transmitting, only one of the RF amplifier sections; a directional coupler circuit for detecting the power of an amplified RF signal that is output from the enabled one of the RF amplifier sections; and a single error detection circuit, coupled to the detecting circuit, for generating an error signal. The error signal has a magnitude that is indicative of a difference between the detected power and a desired power. The error signal is coupled to the enabled one of the RF amplifier sections so as to minimize the magnitude of the error signal. The controller may place a non-enabled RF amplifier section into a low power consumption mode. The directional coupler circuit includes an RF detector coupled to the directional coupler, and an impedance matching circuit coupled between the directional coupler and the RF detector. The impedance matching circuit operates so as to cause the signal output from the RF detector to have about the same magnitude for a given level of output power from any one of the enabled RF amplifier sections. In an illustrative embodiment of this invention one frequency band of interest includes 836 MHz, and another frequency band of interest includes 1880 MHz.

22 Claims, 7 Drawing Sheets

MOBILE STATION HAVING DUAL BAND RF DETECTOR AND GAIN CONTROL

FIELD OF THE INVENTION

This invention relates generally to radiotelephones and, in particular, to radiotelephones or mobile stations such as those capable of operation with a cellular network.

BACKGROUND OF THE INVENTION:

A multi-band mobile station, such as a radiotelephone or personal communicator, is capable of operating in more than one system, each having different frequency bands. By example, and for a dual band mobile station, the mobile station may be capable of operating in a digital cellular mode (e.g., DCS1900 at about 1900 MHz) and an analog cellular mode (e.g., IS-41 (AMPS) at about 830 MHz).

An important component of a mobile station is a transmitter power control subsystem. In general, the transmitter power control subsystem operates by directly sensing the transmitted RF power, usually with an RF directional coupler and a detector diode, and then using the detected signal to close a power control loop by comparing the detected RF power with a value of a transmitter power control signal (TXC).

By example, and referring to FIG. 3, a conventional arrangement for a transmitter power control subsystem of a mobile station that operates in two bands (i.e., Band1 and Band2) includes, for each band, a variable gain amplifier (VGAn), a power amplifier (PAn), and a directional coupler (DCn) coupled to an antenna element (ANTn). Connected to an output of the directional coupler is a detection diode (Dn) having an output connected to an input of an error amplifier (An). A second input of the error amplifier is connected to the transmit power control signal (TXCn). An error signal, representing the difference between the transmitted power commanded by the TXC signal and the actual RF power measured by the directional coupler, is connected to the VGA for either increasing or decreasing the gain of the amplifier so as to drive the error signal to zero at the output of the error amplifier.

As is evident in FIG. 3, a full duplication of components is required for each frequency band. It can be appreciated that in a portable, hand-held device, such as a cellular telephone or a personal communicator, an important goal is to minimize the number of components. However, this has been difficult to accomplish with conventional directional couplers since each is typically tuned to the associated frequency band. As such, a directional coupler tuned for use at, by example, the 800 MHz band will not provide an accurate or usable output if operated at 1900 MHz. U.S. Pat. No. 5,363,071, issued Nov. 8, 1994 entitled "Apparatus And Method For Varying The Coupling Of A Radio Frequency Signal" by D. G. Schwent et al. describes a technique for increasing the dynamic range of a power detector in an automatic power control loop. The technique of Schwent et al. employs a plurality of switches that are coupled to a plurality of coupler elements. FIGS. 1–3 of this patent illustrate various embodiments of prior art RF couplers. The technique of Schwent et al. does not address the problem of providing a single RF coupler that can be used in two different frequency bands.

OBJECTS OF THE INVENTION

It is thus a first object and advantage of this invention to provide a dual band mobile station having an improved transmitter power detection system.

It is an other object and advantage of this invention to provide a directional coupler capable of outputting a signal resulting from one of a plurality of RF sources.

It is a further object and advantage of this invention to provide a directional coupler capable of outputting a signal resulting from one of a plurality of RF sources, an RF detector, and an impedance matching circuit between the directional coupler output and the RF detector.

It is one further object and advantage of this invention to provide a dual band or higher RF transmitter power control system wherein a single error amplifier is enabled to close a power control loop to a plurality of RF amplifier sections.

SUMMARY OF THE INVENTION

The foregoing and other problems are overcome and the objects of the invention are realized by methods and apparatus in accordance with embodiments of this invention.

A multi-band mobile station is disclosed, the mobile station including a plurality of RF amplifier sections, one for each frequency band of interest; a controller for selectively enabling, when transmitting, only one of the RF amplifier sections; a circuit for detecting the power of an amplified RF signal that is output from the enabled one of the RF amplifier sections; and a single error detection circuit, coupled to the detecting circuit, for generating an error signal. The error signal has a magnitude that is indicative of a difference between the detected power and a desired power. The error signal is coupled to the enabled one of the RF amplifier sections so as to minimize the magnitude of the error signal. The controller may place a non-enabled RF amplifier section into a low power consumption mode.

The detecting circuit is comprised of a directional coupler for outputting a detection signal in response to a presence of an amplified RF signal from an enabled RF amplifier section, the directional coupler having a characteristic output impedance; an RF detector coupled to the detection signal for outputting a signal indicative of the power of the amplified RF signal; and an impedance matching circuit coupled between the directional coupler and the RF detector. The impedance matching circuit operates so as to cause the signal output from the RF detector to have about the same magnitude for a given level of output power from any one of the enabled RF amplifier sections.

In an illustrative embodiment of this invention one frequency band of interest includes 836 MHz, and another frequency band of interest includes 1880 MHz.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
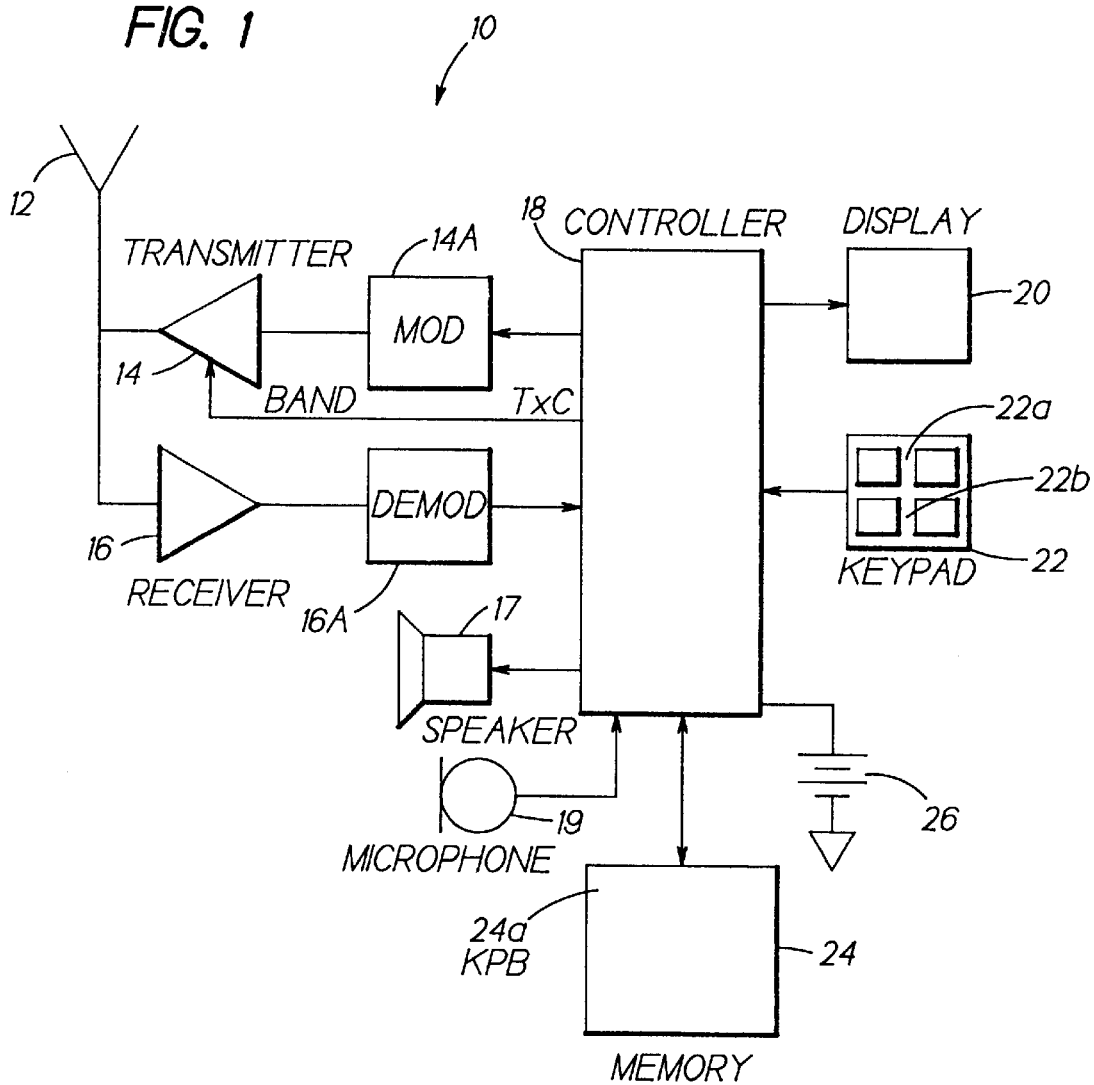
FIG. 1 is a block diagram of a mobile station that is constructed and operated in accordance with this invention.
Figure 2:
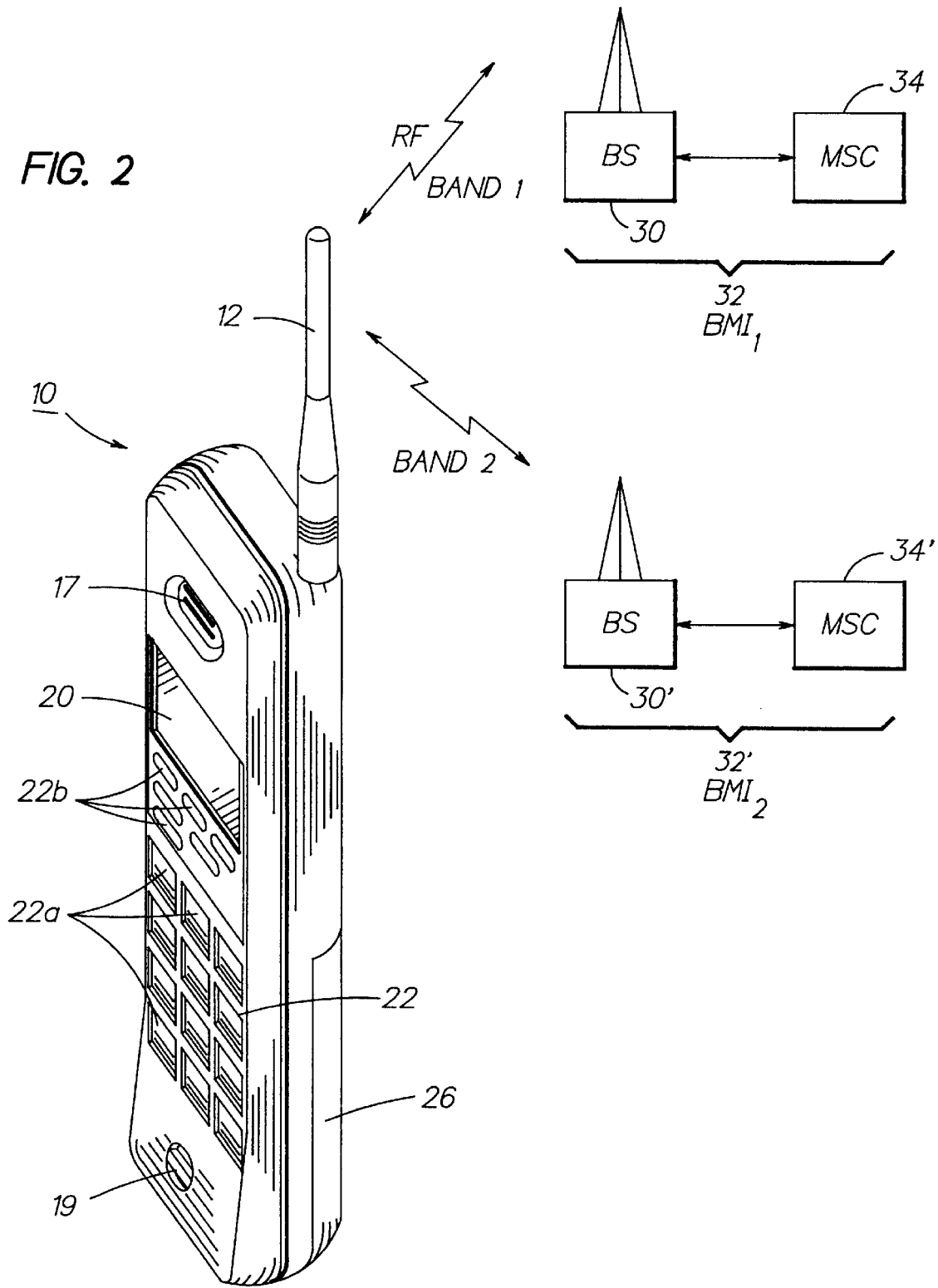
FIG. 2 is an elevational view of the mobile station shown in FIG. 1, and which further illustrates cellular communication systems to which the mobile station can be bidirectionally coupled through wireless RF links.

Before discussing the dual band RF detector in accordance with this invention, it will be useful to first make reference to FIGS. 1 and 2 for illustrating a wireless user terminal or mobile station 10, such as but not limited to a cellular radiotelephone or a personal communicator, that is suitable for practicing this invention. The mobile station 10 includes at least one antenna 12 for transmitting signals to and for receiving signals from a first base site or base station 30. The base station 30 is a part of a first cellular network comprising a Base Station/Mobile Switching Center/Interworking function ($BMI_1$) 32 that includes a mobile switching center (MSC) 34. The MSC 34 provides a connection to landline trunks when the mobile station 10 is involved in a call.

FIG. 2 also shows a second $BMI_2$ 32', having associated base station(s) 30' and MSC 32'. By example, $BMI_1$ 32 may be a digital system (e.g., PCS1900 that operates in the 1900 MHz frequency band), and $BMI_2$ 32' may be an analog system (e.g., IS-41) or another digital system that operates in the 800 MHz frequency band.

The mobile station includes a modulator (MOD) 14A, a transceiver comprised of a transmitter 14 and a receiver 16, a demodulator (DEMOD) 16A, and a controller 18 that provides signals to and receives signals from the transmitter 14 and receiver 16, respectively. These signals include signalling information in accordance with the air interface standard of the applicable cellular system, and also user speech and/or user generated data. For the purposes of this invention the transmitter, receiver, modulator and demodulator are all considered to be dual-mode capable, and can operate with the frequencies, modulation type, access type, etc. of the two communications systems or networks illustrated in FIG. 2. An important aspect of this invention is the operation of the transmitter 14, in particular the use of a dual or higher frequency band compatible RF detector and associated components. Although the receiver 16 must also be capable of functioning in more than one frequency band, the operation of the receiver 16 is not germane to an understanding of this invention, and is not further discussed.

It is understood that the controller 18 also includes the circuitry required for implementing the audio and logic functions of the mobile station. By example, the controller 18 may be comprised of a digital signal processor device, a microprocessor device, and various analog to digital converters, digital to analog converters, and other support circuits. The control and signal processing functions of the mobile station are allocated between these devices according to their respective capabilities. In the illustrated embodiment the controller 18 outputs a mode signal, referred to as BAND, to the transmitter 14 for informing the transmitter of the frequency band within which to operate. By example, if the BAND signal is set high, or asserted, then operation is in the 800 MHz frequency band, and if the BAND signal is set low, or deasserted, then operation is in the 1900 MHz frequency band.

It should be noted that the BAND signal will also be normally provided to the receiver 16 and other circuitry. However, the dual band operation of these circuits is not germane to an understanding of this invention, and will not be further discussed.

The controller also provides a transmitter power control setting signal (TXC) to the transmitter 14 for controlling the output power of the transmitter 14. In the illustrated dual band embodiment the value of TXC for a given value of output power in BAND1 may not necessarily equal the value of TXC for the same value of output power in BAND2.

A user interface includes a conventional earphone or speaker 17, a conventional microphone 19, a display 20, and a user input device, typically a keypad 22, all of which are coupled to the controller 18. The keypad 22 includes the conventional numeric (0–9) and related keys (#,*) 22a, and other keys 22b used for operating the mobile station 10. These other keys 22b may include, by example, a SEND key, various menu scrolling and soft keys, and a PWR key. The mobile station 10 also includes a battery 26 for powering the various circuits that are required to operate the mobile station.

The mobile station 10 also includes various memories, shown collectively as the memory 24, wherein are stored a plurality of constants and variables that are used by the controller 18 during the operation of the mobile station. For example, the memory 24 stores the values of various cellular system parameters and the number assignment module (NAM). An operating program for controlling the operation of controller 18 is also stored in the memory 24 (typically in a ROM device). The memory 24 may also store data, including user messages, that is received from the BMI 32 prior to the display of the messages to the user.

Figure 4:
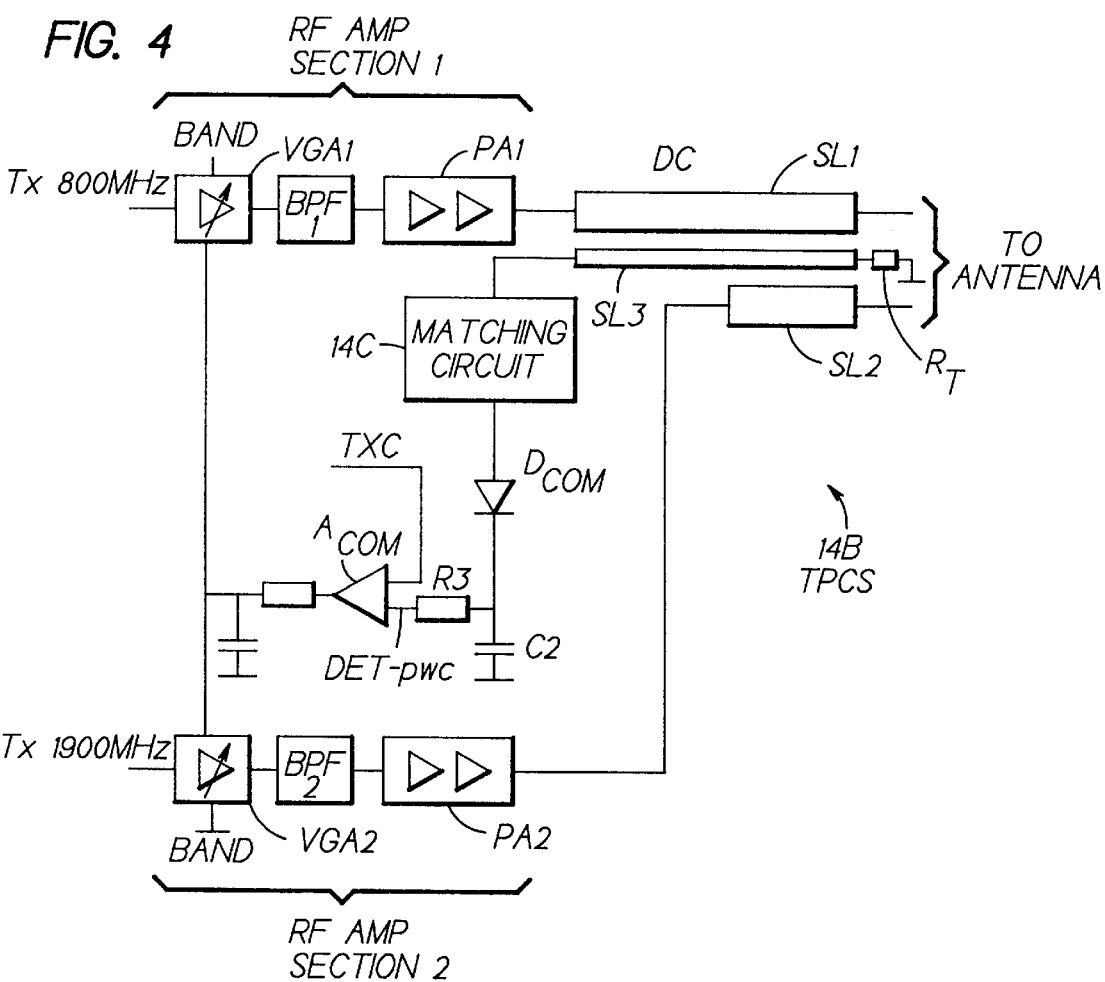
FIG. 4 is a simplified schematic diagram of a dual band RF detector arrangement having a band matching circuit in accordance with this invention.

Reference is now made to FIG. 4 for illustrating an improved transmitter power control subsystem (TPCS) 14B that is understood to form a part of the transmitter 14 of FIG. 1. The TPCS 14B is arranged to receive, in this embodiment, a first transmitter signal (Tx) in the 800 MHz band and a second TX signal in the 1900 MHz band. It should be understood that at any given time the mobile station 10 is only transmitting in one of the two bands. It should be further understood that the use of 800 MHz and 1900 MHz frequency bands is exemplary, and should not be construed as a limitation upon the practice of this invention. Each of the two Tx signals is applied to a respective variable gain amplifier (VGA1 and VGA2), and then to an associated band pass filter (BPF1 and BPF2). The filtered signals are then applied to respective power amplifiers PA1 and PA2. The combination of a VGA, BPF, and PA may be considered to be a variable gain RF amplifier section.

In accordance with an aspect of this invention the outputs of PA1 and PA2 are applied to a multi-element directional coupler (DC) having a first element or strip line (SL1), a second element or strip line (SL2) and a third, common element or strip line (SL3). The RF signal from PA1 passes through SL1 on the its way to the antenna (not shown). In like manner the output of PA2 passes through SL2. SL3 is interposed between SL1 and SL2 for having induced therein by RF coupling a signal indicative the power of the RF signal passing through either SL1 or SL2. A suitable terminator $R_T$ can be coupled SL3 to reduce or eliminate reflected signals. By example, the terminator $R_T$ may be a resistance having a value that is approximately equal to the impedance of SL3, or about 100 ohms in the illustrated example. SL1 and SL2 may each have an impedance of about 50 ohms, and SL3 is made narrower in order to have a higher impedance.

Further in accordance with this invention an impedance matching circuit 14C is interposed between the output of SL3 and a single or common detector diode Dcom. The output of Dcom is connected to a common error amplifier Acom having an output connected to control inputs of both VGA1 and VGA2. In the illustrated embodiment of this invention a common TXC signal is supplied to Acom by the controller 18 of FIG. 1. Applied to an enabling input of VGA1 is the BAND signal, while an inverted BAND signal is applied to the enabling input of VGA2. By example, when the BAND signal is high VGA1 is enabled and VGA2 is disabled, preferably powered-down, resulting in operation in the 800 MHz band. Conversely, when BAND is low VGA1 is disabled and VGA2 is enabled, resulting in operation in the 1900 MHz band. Alternatively, or in combination with the illustrated embodiment, a SPST switch can be provided at the output of each VGA to open the signal path from the amplifier of the non-selected band, and close the signal path from the output of the amplifier of the selected band. In this case the switches are controlled by the BAND signal and its inverse. The TXC signal is set in a conventional manner to control the transmitted power for the selected operational band.

In other embodiments of this invention separate transmitter gain control signals (TXCs) can be used, one for each amplifier (frequency band of interest).

Figure 3:
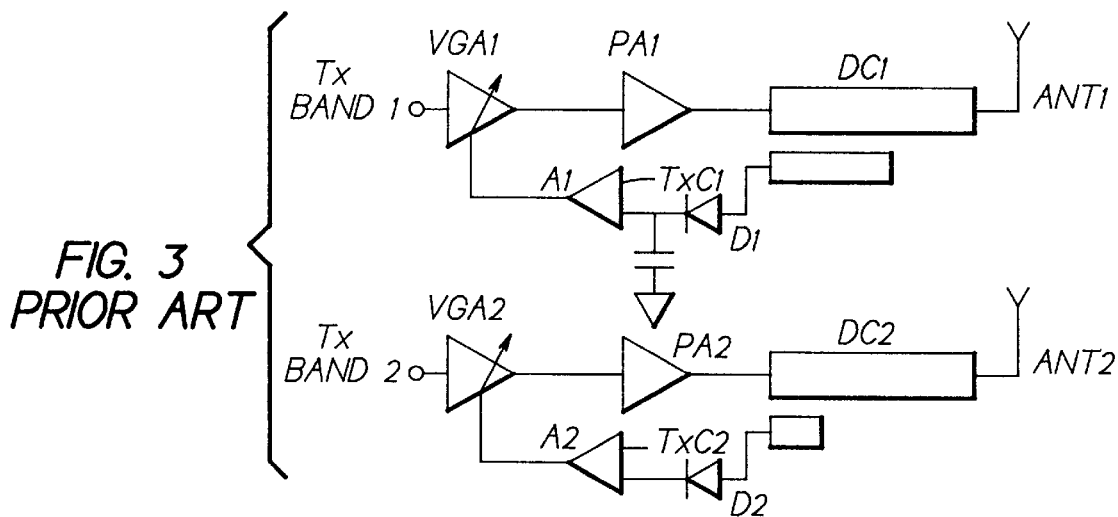
FIG. 3 is a simplified schematic diagram of a conventional dual band RF detector arrangement.

By using the same detector Dcom to detect the transmitted power, and one gain control signal TXC, in both bands, only one detector and one control line are needed to control transmitted power level. This reduces the component count and required circuit board area over the conventional approach illustrated in FIG. 3, thereby enabling a reduction in cost, complexity, and size.

In FIG. 4 the lengths of SL1 and SL2 are related to their respective operating frequencies, and are selected to give approximately the same degree of coupling in both bands. For the illustrated example of 800/1900 MHz operation, the directional coupler elements may have the following dimensions:

SL1 L=15 mm, W=1 mm;
SL2 L=7.5 mm, W=1 mm; and
SL3 L=15 mm, W=0.2 mm.

The insertion loss has been found not to increase significantly due to the presence of the third coupled line.

Impedance matching to the detector diode Dcom is accomplished so that the diode input impedance, seen from the directional coupler, is as close to 100 ohms as possible for both operating frequency bands. While wide band matching could be accomplished by adding shunt resistance to the detector diode Dcom, this approach would decrease the detected voltage and is undesirable.

Instead, this invention employs the matching circuit 14C which circulates the impedance around the Smith chart (see FIG. 7) and gives the proper impedance matching in both operating frequency bands. Matching between the frequencies is not important.

Figure 5:
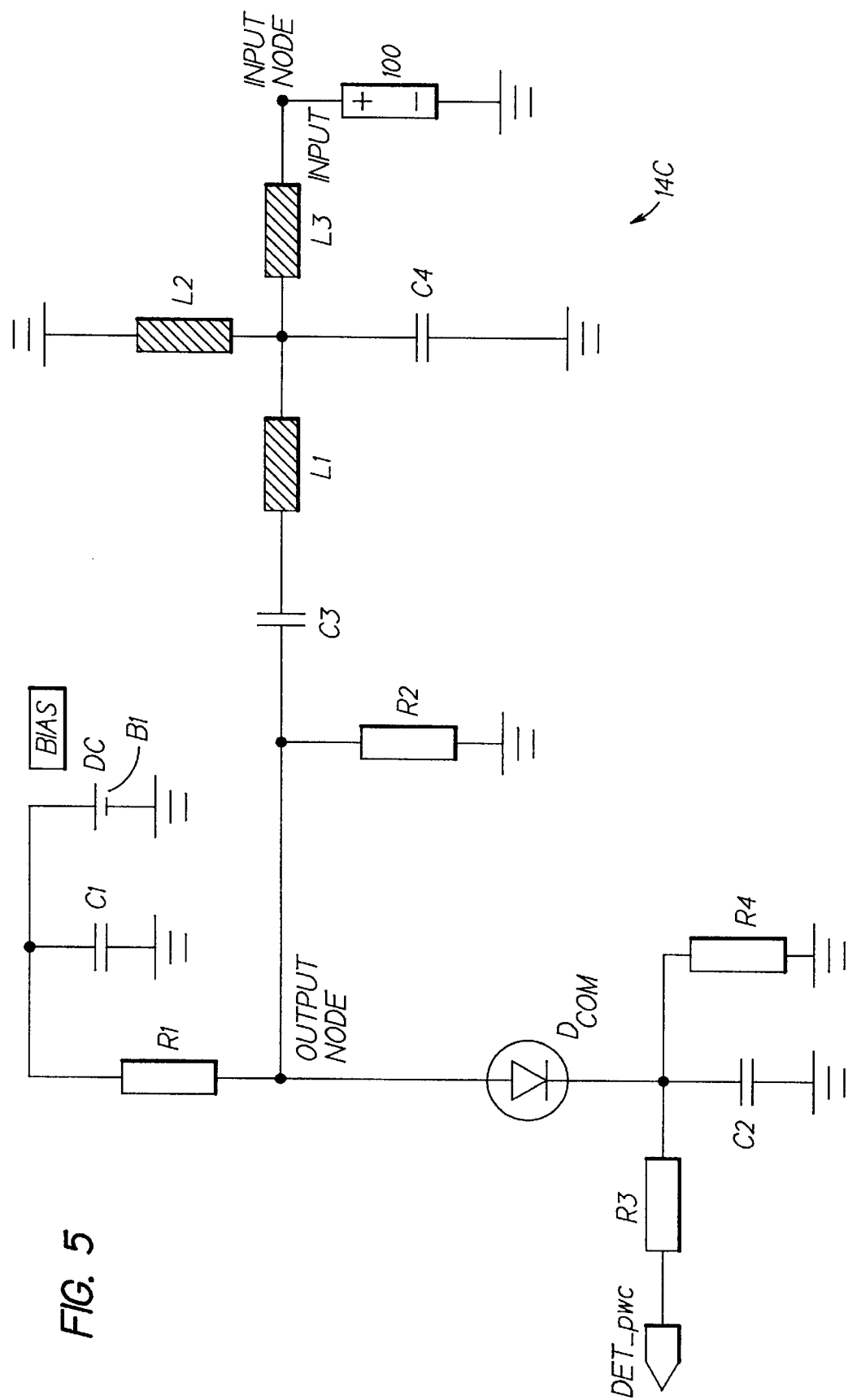
FIG. 5 is a schematic diagram of a presently preferred embodiment of the band matching circuit of FIG. 4.

Referring now to FIG. 5, a schematic diagram of the impedance matching circuit 14C is shown, as is the coupling of Dcom and its associated components to the output of the matching circuit 14C. The matching circuit 14C has an input node coupled to SL3, represented by a 100 ohm impedance, and an output node coupled to the anode of Dcom. A DC bias source, schematically represented by the battery B1, is also illustrated. For the exemplary component values listed below (where L is length and W is width), a suitable value for the output of the bias source is about 2.8 Volts DC.

R1=3.3 k
R2=470
R3=4.7 k
R4=10 k
C1=10 nF
C2=22 pF
C3=27 pF
C4=1.8 pF
L1=12.4 mm, W=0.2 mm
L2=14.3 mm, W=0.2 mm
L3=2.2 mm, W=0.2 mm

Figure 6:
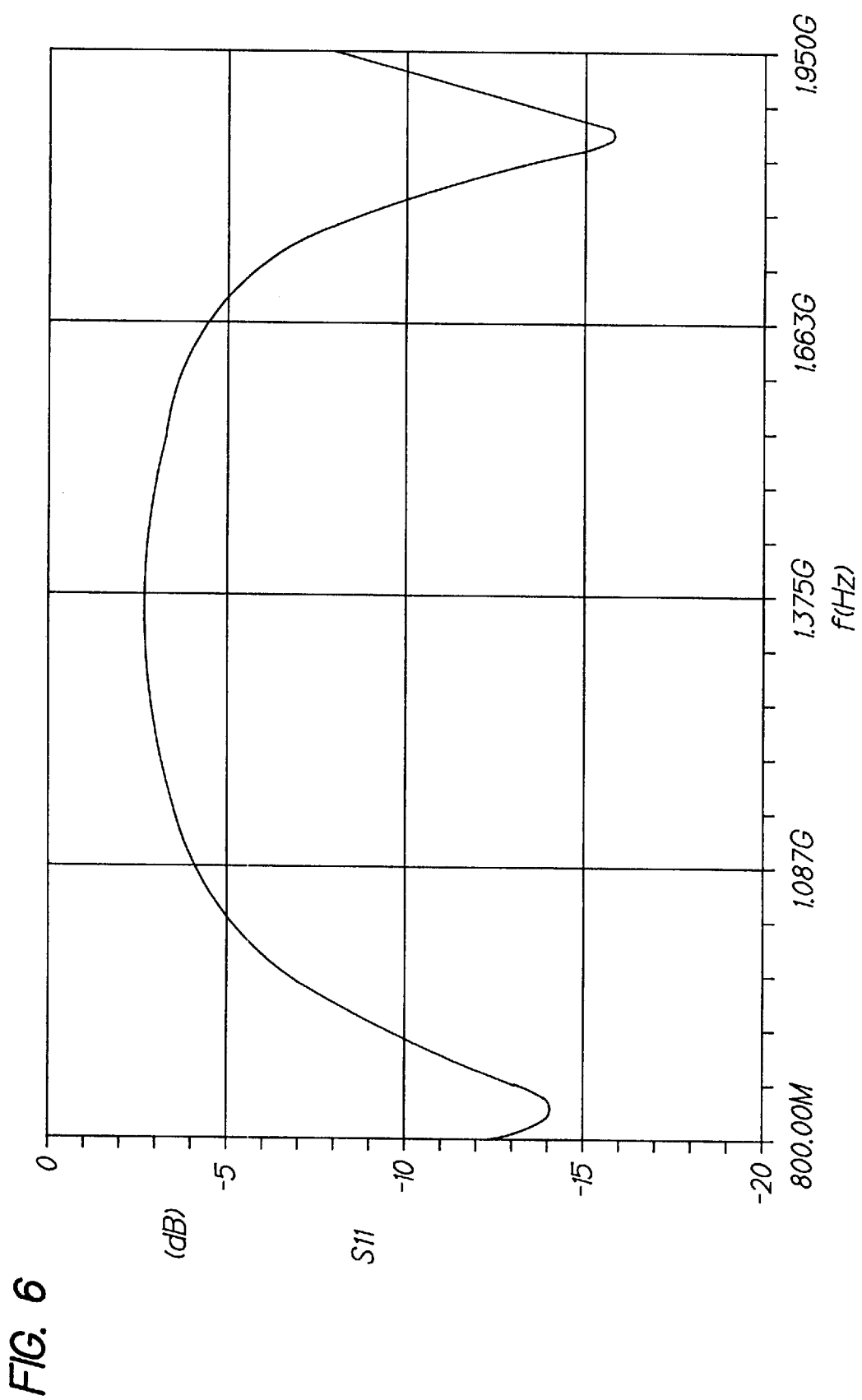
FIG. 6 is a graph showing the reflection attenuation S11, which is indicative of impedance matching, as seen from the directional coupler over an exemplary band of frequencies from 800 MHz to 1950 MHz.
Figure 7:
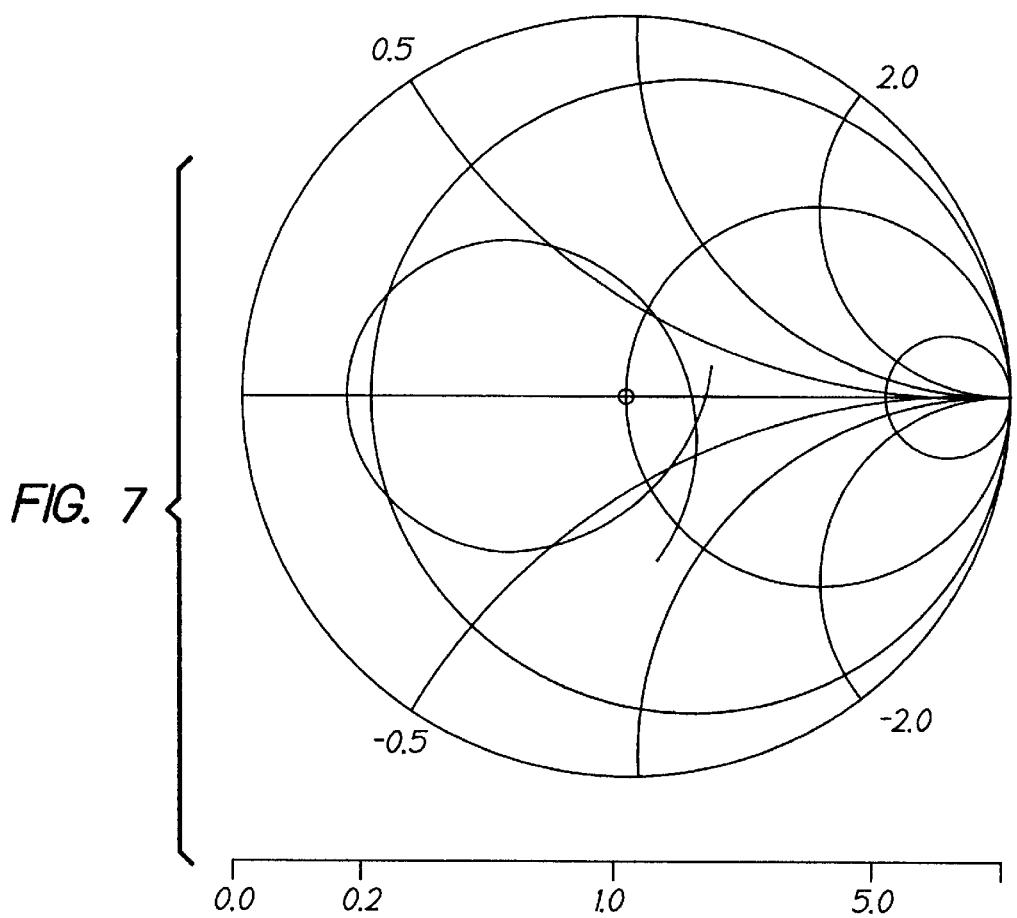
FIG. 7 illustrates the graph of FIG. 6 in a Smith chart format.
Figure 8:
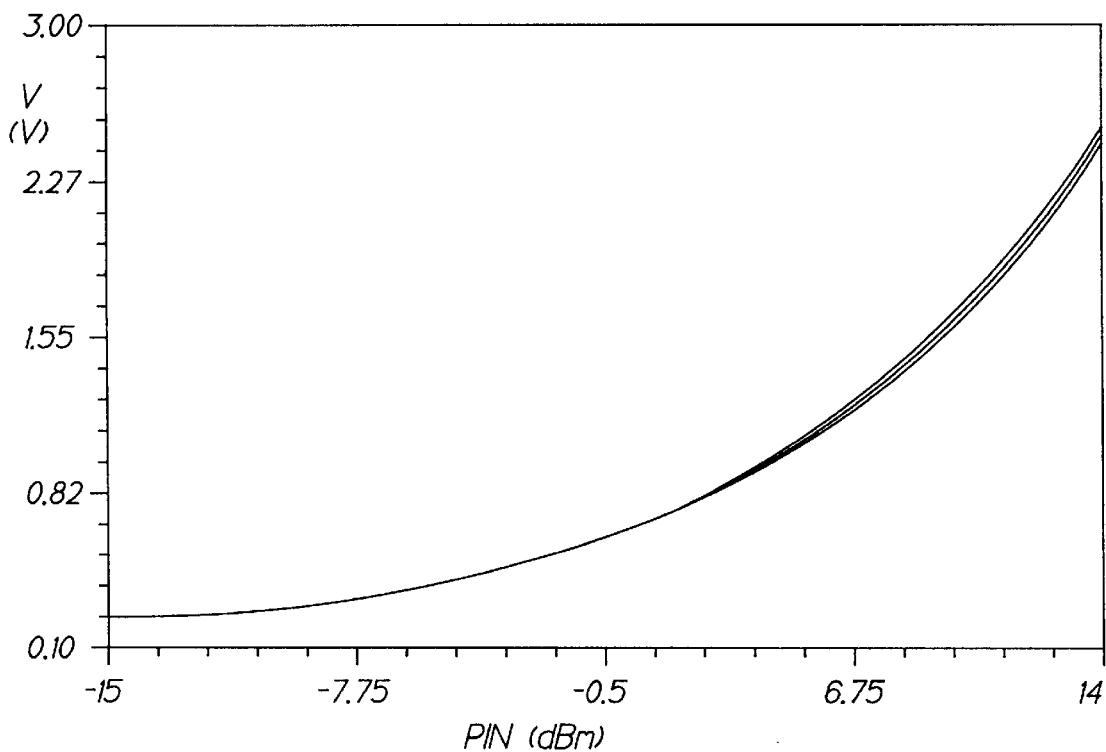
FIG. 8 is a graph showing the detected voltage versus power fed to the detection diode through the matching circuit of FIG. 5 at 824, 836, and 849 MHz.
Figure 9:
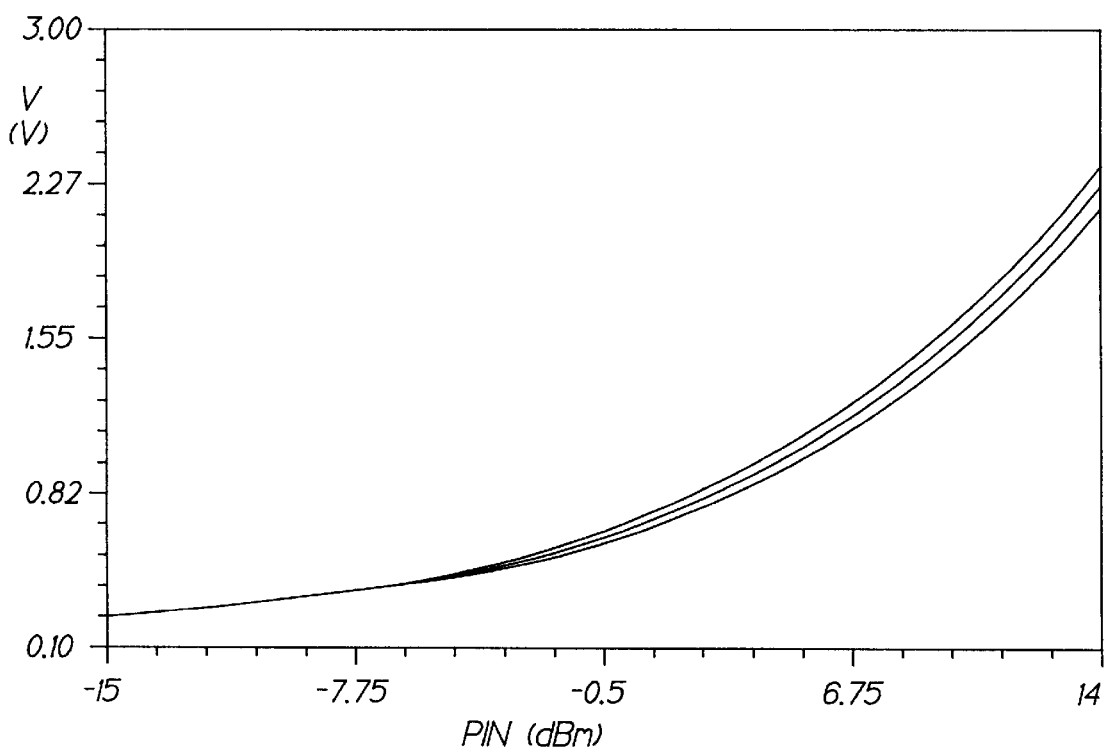
FIG. 9 is a graph similar to that shown in FIG. 8, but taken at the frequencies of 1850, 1880 and 1910 MHz.

FIG. 6 is a graph showing the reflection attenuation (S11) as seen from the directional coupler DC over the band of frequencies from 800 MHz to 1950 MHz (the larger the reflection attenuation the better is the impedance matching); FIG. 7 illustrates the graph of FIG. 6 in a Smith chart format; FIG. 8 is a graph showing the detected voltage ($DET_{13}$ pwc) versus power fed to Dcom through the matching circuit 14C at 824, 836, and 849 MHz (note that -17 dB coupling " 0 dBm in the graph is equal to +17 dBm output power); and FIG. 9 is a graph similar to that shown in FIG. 8, but taken at the frequencies of 1850, 1880 and 1910 MHz (i.e., BAND2). It is instructive to note that the curves shown in FIG. 9 for BAND2 are very similar to the curves shown in FIG. 8 for BAND1. This clearly indicates that the dual band directional coupler DC and matching circuit combination provides proper operation in both frequency bands of interest, which is the desired result. Although described in the context of preferred embodiments, it should be realized that a number of modifications to these teachings may occur to one skilled in the art. By example, and as was previously indicated, the teaching of this invention is not limited to only the frequency bands of 800 MHz and 1900 MHZ. In general, the benefits of the teaching of this invention can be employed for any two frequency bands wherein the two bands are sufficiently far apart that a single directional coupler tuned so as to provide an adequate output to a detection diode from both bands, and thus where the prior art approach would be to provide two discrete directional couplers with associated detection diodes, error amplifiers, etc.

It should also be realized that other circuitry may be provided in the TPCS 14B. For example, circuitry can be provided for temperature compensating Dcom for changes in ambient temperature and/or for increases in diode temperature when operating at high power levels for extended periods.

Figure 10:
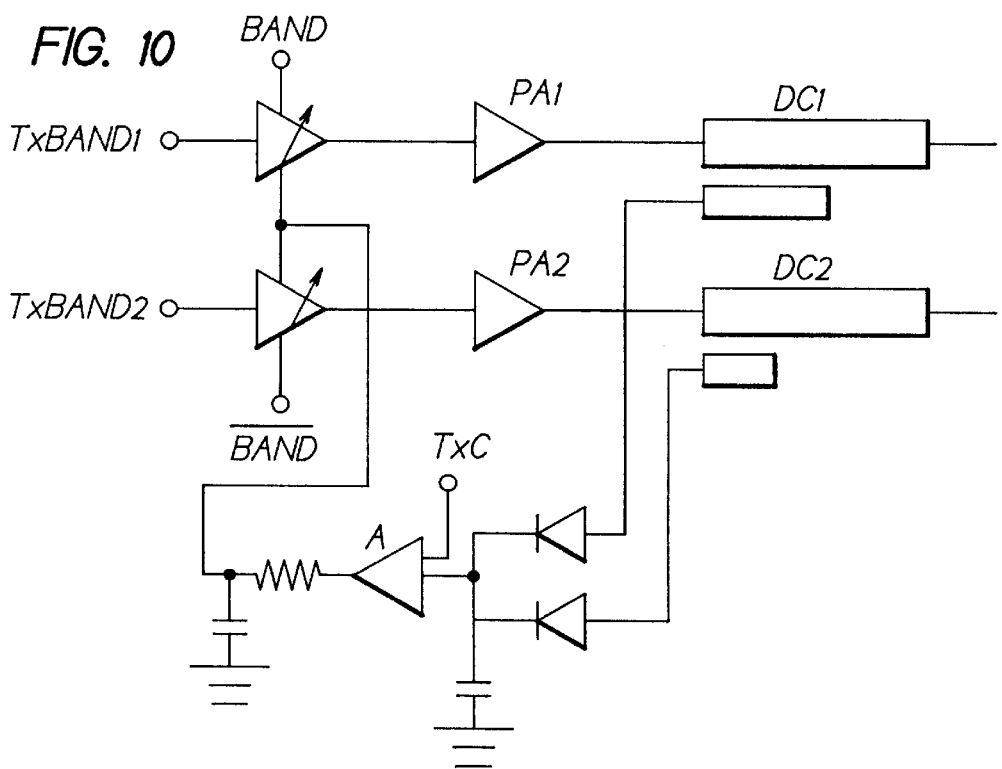
FIG. 10 is a simplified schematic diagram of a dual band RF detector arrangement in accordance with a second embodiment of this invention.

Further by example, and referring to FIG. 10, two directional couplers DC1 and DC2 may each be provided, each having an associated detection diode D1 and D2. In this embodiment both diodes feed a common error amplifier A, thereby reducing component count over the embodiment of FIG. 3. This embodiment relies on the use of the BAND signal, and the disabling of one of the transmitters at any given time. The embodiment of FIG. 10 provides a simplification in impedance matching. Furthermore, and assuming a multi-layered printed circuit board as a substrate for the directional coupler strip line metalization, the sensing line of the directional couplers can be placed in the second (nonsurface) layer beneath the line that carriers the RF signal, thereby freeing some amount of surface area for use by other components. In contradistinction, in the embodiment of FIG. 4 it may be desirable to place the sensing line SL3, and the lines SL1 and SL2 that carry the RF signal, on the same surface (e.g., top surface) so that SL3 can be optimally spaced apart from both SL1 and SL2.

It should also be realized that the embodiments of this invention can be extended to mobile stations that operate in more than two frequency bands (i.e., multi-band mobile stations). For the case of the first embodiment this can be accomplished by providing suitable modifications to the directional coupler and matching circuit so as accommodate the additional RF signal path or paths. By example only, a quad-band mobile station could be constructed to have two of the directional couplers of FIG. 4, two matching circuits, and two RF detectors (diodes), the outputs of which are arranged as in FIG. 10 for feeding a common error amplifier. In this case the BAND signal can be extended to two bits for specifying one of four RF amplifier sections for use at any given time.

Thus, while the invention has been particularly shown and described with respect to preferred embodiments thereof, it will be understood by those skilled in the art that changes in form and details may be made therein without departing from the scope and spirit of the invention.

What is claimed is:

1. A dual band RF transmitter, comprising:

a first variable gain RF amplifier section having an output that provides, when enabled, an amplified RF signal for frequencies within a first band of frequencies;

a second variable gain RF amplifier section having an output that selectively provides, when enabled, an amplified RF signal for frequencies within a second band of frequencies;

a directional coupler having inputs coupled to said outputs of said first and second RF amplifier sections and an output providing an RF output signal having a magnitude that is a function of the power of an amplified RF signal passing through said directional coupler from an enabled one of said first and second RF amplifier sections;

an RF detector having an output for providing an RF power detection signal; and an impedance matching circuit interposed between said output of said directional coupler and an input of said RF detector, said impedance matching circuit operating so as to cause said RF power detection signal to have about the same magnitude for a given level of output power from either of said first and second RF amplifier sections.

2. A dual band RF transmitter as in claim 1, and further comprising an error amplifier having a first input coupled to an output of said RF detector, a second input coupled to a transmitter power setting control signal, and an output providing an error signal having a magnitude that is a function of a difference between a magnitude of said output of said RF detector and said transmitter power control setting signal, said error signal being coupled to both of said first and second RF amplifier sections for controlling the gain of an active one of said first and second RF amplifier sections.

3. A dual band RF transmitter as in claim 1, wherein said first and second RF amplifier sections each have an input coupled to an control signal and are responsive to said control signal for enabling only one of said first and second RF amplifier sections for operation at any given time.

4. A dual band RF transmitter as in claim 1, wherein said directional coupler is comprised of a plurality of tuned strip lines, a first strip line having an input coupled to said output of said first RF amplifier section, a second strip line having an input coupled to said output of said second RF amplifier section, and a third strip line that is disposed relative to said first and second strip lines for having an RF signal induced therein from one of said first and second strip lines for providing said RF output signal having a magnitude that is a function of the power of the amplified RF signal passing through one of said first and second RF strip lines.

5. A dual band RF transmitter as in claim 4, wherein said first strip line has an impedance of about 50 ohms, wherein said second strip line has an impedance of about 50 ohms, and wherein said third strip line has an impedance of about 100 ohms.

6. A dual band RF transmitter as in claim 4, wherein the first band of frequencies includes 836 MHz, wherein the second band of frequencies includes 1880 MHz, wherein said first strip line has a length equal to about 15 mm and a width equal to about 1 mm, wherein said second strip line has a length equal to about 7.5 mm and a width equal to about 1 mm, and wherein said third strip line has a length equal to about 15 mm and a width equal to about 0.2 mm.

7. A dual band RF transmitter as in claim 1, wherein said impedance matching circuit includes an impedance matching network, an input node of said impedance matching circuit being coupled to said impedance matching network, said impedance matching network being comprised of a plurality of strip lines, a first strip line having a first end coupled to the input node and a second end, a second strip line having a first end coupled to ground and a second end coupled to the second end of the first strip line at a common node, and a third strip line having a first end coupled to the common node and a second end coupled to said RF detector.

8. A dual band RF transmitter as in claim 7, wherein the first band of frequencies includes 836 MHz, wherein the second band of frequencies includes 1880 MHz, wherein said third strip line has a length equal to about 12.4 mm and a width equal to about 0.2 mm, said second strip line has a length equal to about 14.3 mm and a width equal to about 0.2 mm, and said first strip line has a length equal to about 2.2 mm and a width equal to about 0.2 mm.

9. A dual band RF transmitter as in claim 7, wherein said impedance matching network is further comprised of a capacitance having a first terminal coupled to said common node and a second terminal coupled to ground.

10. A dual band RF transmitter as in claim 8, wherein said impedance matching network is further comprised of a capacitance having a first terminal coupled to said common node and a second terminal coupled to ground, said capacitance having a value of about 1.8 pF.

11. A dual band mobile station, comprising:

at least one antenna;

a transceiver coupled to said at least one antenna; and a controller coupled to said transceiver for controlling an operation of said transceiver when operating in one of a first band of frequencies and a second band of frequencies; wherein said transceiver is comprised of a dual band transmitter comprised of first and second variable gain RF amplifier sections each having an output coupled to said at least one antenna through a directional coupler, said directional coupler having an output providing an RF output signal having a magnitude that is a function of the power of an amplified RF signal passing through said directional coupler from a selected one of said first and second RF amplifier sections, one of said first and second RF sections being selected for operation in accordance with a mode signal generated by said controller;

an RF detector having an output for providing an RF power detection signal;

an impedance matching circuit interposed between said output of said directional coupler and an input of said RF detector, said impedance matching circuit operating so as to cause said RF power detection signal to have about the same magnitude for a given level of output power from either of said first and second RF amplifier sections; and an error amplifier having a first input coupled to an output of said RF detector, a second input coupled to a transmitter power control setting signal generated by said controller, and an output providing an error signal having a magnitude that is a function of a difference between a magnitude of said output of said RF detector and said transmitter power control setting signal, said error signal being coupled to both of said first and second RF amplifier sections for controlling the gain of the selected one of said first and second RF amplifier sections.

12. A dual band mobile station as in claim 11, wherein a non-selected one of said first and second RF amplifier sections is placed in a low power consumption mode.

13. A dual band mobile station as in claim 11, wherein the first band of frequencies includes 836 MHz, and wherein the second band of frequencies includes 1880 MHz.

14. A dual band RF transmitter, comprising:

a first variable gain RF amplifier section having an output that provides, when enabled by a mode control signal, an amplified RF signal for frequencies within a first band of frequencies;

a second variable gain RF amplifier section having an output that provides, when enabled by said mode control signal, an amplified RF signal for frequencies within a second band of frequencies;

a first directional coupler having an input coupled to said output of said first RF amplifier section and an output providing a first RF output signal having a magnitude that is a function of the power of an amplified RF signal passing through said first directional coupler from said first RF amplifier section;

a second directional coupler having an input coupled to said output of said second RF amplifier section and an output providing a second RF output signal having a magnitude that is a function of the power of an amplified RF signal passing through said second directional coupler from said second RF amplifier section;

a first RF detector having an input coupled to said first RF output signal for providing a first RF power detection signal;

a second RF detector having an input coupled to said second RF output signal for providing a second RF power detection signal; and an error amplifier having a first input coupled to both of said first and second RF power detection signals, a second input coupled to a transmitter power control setting signal, and an output providing an error signal having a magnitude that is a function of a difference between a magnitude of an active one of said RF power detection signals and said transmitter power control setting signal, said error signal being coupled to both of said first and second RF amplifier sections for controlling the gain of the active one of said first and second RF amplifier sections.

15. A method of operating a multi-band mobile station, comprising the steps of:

providing a separate RF amplifier section for each frequency band of interest, wherein a particular frequency band of interest does not overlap another frequency band of interest, and wherein each separate RF amplifier section is used for amplifying RF signals within only one of the frequency bands of interest;

selectively enabling, when transmitting, only one of the separate RF amplifier sections;

detecting the power of an amplified RF signal that is output from the enabled one of the separate RF amplifier sections;

providing a single error detection circuit and generating an error signal with the single error detection circuit, the error signal having a magnitude that is indicative of a difference between the detected power and a desired power; and inputting the error signal to the enabled one of the separate RF amplifier sections so as to minimize the magnitude of the error signal.

16. A method as set forth in claim 15, wherein the step of selectively enabling includes a step of placing a non-enabled RF amplifier section into a low power consumption mode.

17. A method as set forth in claim 15, wherein the step of detecting includes the steps of:

outputting a detection signal from a directional coupler through which the amplified RF signal from each separate RF amplifier section passes, when enabled, the directional coupler having a characteristic output impedance;

inputting the detection signal to an RF detector; and providing an impedance matching circuit between the directional coupler and the RF detector.

18. A method as set forth in claim 15, wherein one frequency band of interest includes 836 MHz, and wherein another frequency band of interest includes 1880 MHz.

19. A multi-band mobile station, comprising:

a plurality of separate RF amplifier sections, one for each frequency band of interest, wherein a particular frequency band of interest does not overlap another frequency band of interest, and wherein each separate RF amplifier section is used for amplifying RF signals within only one of the frequency bands of interest;

a controller for selectively enabling, when transmitting, only one of the separate RF amplifier sections;

a circuit for detecting the power of an amplified RF signal that is output from the enabled one of the separate RF amplifier sections; and a single error detection circuit, coupled to said detecting circuit, for generating an error signal, the error signal having a magnitude that is indicative of a difference between the detected power and a desired power, the error signal being coupled to the enabled one of the separate RF amplifier sections so as to minimize the magnitude of the error signal.

20. A multi-mode mobile station as in claim 19, wherein the controller places a non-enabled RF amplifier section into a low power consumption mode.

21. A multi-mode mobile station as in claim 19, wherein said detecting circuit is comprised of:

a directional coupler for outputting a detection signal in response to a presence of an amplified RF signal from an enabled RF amplifier section, the directional coupler having a characteristic output impedance;

an RF detector coupled to said detection signal; and an impedance matching circuit coupled between said directional coupler and said RF detector.

22. A multi-mode mobile station as in claim 19, wherein one frequency band of interest includes 836 MHz, and wherein another frequency band of interest includes 1880 MHz.

* * * * *